(12) United States Patent
Weibel IV et al.

(10) Patent No.: US 6,356,219 B1
(45) Date of Patent: Mar. 12, 2002

(54) CALIBRATED ENCODER MULTIPLIER

(75) Inventors: Alexander R. Weibel IV, Coraopolis; David A. Deutsch, Monroeville, both of PA (US)

(73) Assignee: Aerotech, Inc., Pittsburgh, PA (US)

(*) Notice: Subject to any disclaimer, the term of this patent is extended or adjusted under 35 U.S.C. 154(b) by 0 days.

(21) Appl. No.: 09/799,157

(22) Filed: Mar. 5, 2001

(51) Int. Cl.$^7$ ................................................. H03M 1/10
(52) U.S. Cl. ........................ 341/120; 318/608; 341/143
(58) Field of Search .............................. 341/120, 121, 341/155, 156, 142, 118, 143, 160, 161, 157

(56) References Cited

U.S. PATENT DOCUMENTS

| | | | | |
|---|---|---|---|---|
| 4,137,533 A | * | 1/1979 | Briechle et al. | 343/7.7 |
| 5,001,727 A | * | 3/1991 | McDavid | 375/80 |
| 5,138,564 A | | 8/1992 | de Jong et al. | 364/571.04 |
| 6,018,552 A | * | 1/2000 | Uesugi | 375/330 |
| 6,037,735 A | * | 3/2000 | Janosky et al. | 318/608 |

OTHER PUBLICATIONS

Hathaway Motion Control, Computer Optical Products, Inc. Application Note "Sine/Cosine Encoder Application", 4 pages, Dec. 24, 1996.

* cited by examiner

*Primary Examiner*—Brian Young
*Assistant Examiner*—John Nguyen
(74) *Attorney, Agent, or Firm*—Webb Ziesenheim Logsdon Orkin & Hanson, P.C.

(57) ABSTRACT

A device for receiving first and second analog signals consisting of two sinusoidal signals shifted in phase from an encoder and outputting digital pulses corresponding to the approximate number of equal steps the system of which the encoder is a part has advanced or retreated comprising flash memory storing a table relating total value counts to the precise value as previously determined by calibration and that adds or subtracts counts to or from a difference register so that the count in the difference register corresponds to the calibrated value moved by the system.

7 Claims, 1 Drawing Sheet

CALIBRATED ENCODER MULTIPLIER

FIELD OF THE INVENTION

This invention relates to the control of a system, for example, rotary and linear motors with a feedback based upon signals from an optical encoder or magnetic encoder or the like.

BACKGROUND OF THE INVENTION

Typical motion control systems make use of a feedback transducer in a control loop. Referring to FIG. 1, a generalized motion control loop is shown. A motion control circuit 1 generates a digital command signal 2 and compares it in a summing or subtracting circuit 3 to a digital position feedback signal 4. The comparison may comprise a simple subtraction of the feedback signal from the command signal. The difference or error signal is used to generate an analog current command signal 5 applied to an amplifier 6 driving a motor 7. The motor may be a rotary motor, a rotary motor connected to a ball screw for driving a linear stage, or a linear motor driving a linear stage. Associated with the motor or stage is an encoder 8. In the case of the optical encoder, a disk that rotates with the motor or a plate that is associated either with the positioning table or the track for the positioning table is scribed with a plurality of substantially equally spaced lines. The optical encoder 8 senses the passing lines and generates two-channel analog quadrature signals (SIN and COS). An encoder multiplier 9 processes the digitized SIN and COS signals to resolve them to define a position within a single SIN and COS signal period. The position is represented by a count which is between zero and the maximum count generated for one SIN or COS signal period. A signal is then either generated from the quadrature pair or separately generated to keep track of which scribe lines the stage or motor is between. A microprocessor or digital signal processor at interrupt intervals subtracts the previous count from the instant count and outputs pulses 10 corresponding to the difference. Each pulse is associated with one approximate machine step, that is, the approximate distance the motor or stage moves to cause the encoder multiplier to generate a count. The pulses are passed to the motion control circuit where they are summed, for example, in an up/down counter 11, and the sum is passed to the summing circuit.

In typical systems, the encoder multiplier and motion control circuit are on separate printed circuit cards. The output from the encoder multiplier card is often passed to more than one control card programmed to activate devices outside the motion control system.

The amount of information available from the encoder and associated encoder multiplier is limited by manufacturing methods associated with these devices. The amount of information is defined in units of distance (angular or linear) and is commonly referred to as resolution. In high performance systems, the information obtained directly from the encoder is not sufficient to achieve performance goals. This is the reason for the use of the encoder multiplier which divides the analog SIN and COS signals into discrete values, for example, with the use of an arctangent lookup table. Available encoder multipliers can boost system resolution by factors from 2 to 250 times.

A problem inherent in the mechanical system including the encoder is limited accuracy. System accuracy can be improved by calibration. Calibration methods involve generating error correction data that can be accessed by the motion controller. In prior art motion control systems, the correction takes place in the motion control circuit by corrections made to either the command or error signal.

For certain applications, making the error correction in the motion control circuit to the command signal or the error signal is unacceptable. The most common case is where the signals from the encoder multiplier are used in other parts of a larger system. For example, the position information may be linked to a data acquisition system for purposes of archiving data and/or data overlaying. In these applications, error correction at the motion control circuit level will result in the system position and other controlled events being out of synchronization.

SUMMARY OF THE INVENTION

It is an advantage, according to the present invention, to provide an encoder multiplier that introduces correcting counts into the output signal therefrom at high speed, thus providing improved system accuracy.

It is an advantage, according to the present invention, to perform high speed calibration correction on the encoder feedback signals.

It is a farther advantage, according to the present invention, that external systems can use the calibrated data.

It is a still further advantage, according to the present invention, that real-time, highly accurate position information eliminates the requirement for much more costly feedback solutions, such as laser interferometer feedback, except at the time of calibration.

It is yet a further advantage, according to the present invention, that a controller card capable of making calibration adjustments is not required and the computation time needed to generate corrected trajectories is eliminated.

Briefly, according to the present invention, there is provided a device, for example, an encoder multiplier for receiving analog signals, commonly referred to as SIN and COS, from an encoder and outputting digital pulses corresponding approximately to the number of equal steps the system of which the encoder is a part has advanced or retreated comprising:

an analog-to-digital converter for digitizing the SIN and COS input signals, an arctangent lookup table for calculating a relative value, for example, position count within one SIN or COS period from the digitized SIN and COS signals, a cycle detector for recognizing advance or retreat to an adjacent SIN or COS period, an up/down counter for holding the total position counts accumulated since the system has moved from a datum position, flash memory storing a table relating total position counts to the precise position as determined by calibration using a recognized calibration standard gauge, a digital processor having a defined interrupt interval, the digital signal processor programmed, in response to each new interrupt interval, to:

i) digitize the analog SIN and COS signals, ii) input the digitized SIN and COS signals and, with reference to the arctangent table, calculate the position count, iii) subtract the current position count from the last position count within one SIN or COS period and storing in a difference register, and iv) with reference to the flash memory table, add or subtract counts to or from the difference register so that the count in the difference register corresponds to the calibrated distance traversed by the system, a pulse generator for outputting the number of pulses in the difference register within an interrupt interval, and connections or buses to convey the calibrated signal.

BRIEF DESCRIPTION OF THE DRAWINGS

Further features and other objects and advantages will be understood from the following description made with reference to the drawings in which.

DESCRIPTION OF THE PREFERRED EMBODIMENTS

Figure 1:
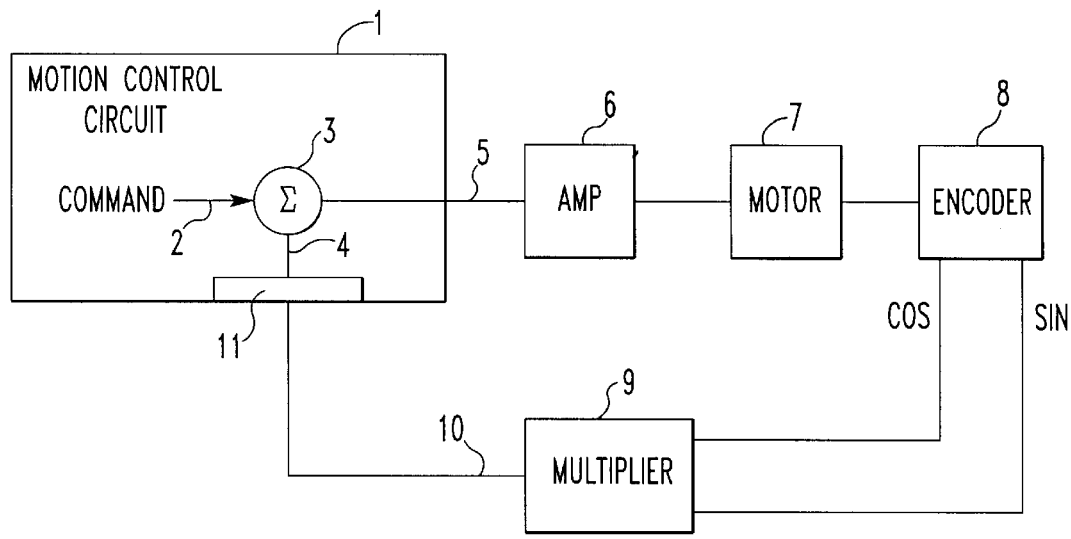
FIG. 1 is a diagram illustrating a generic motion control circuit.

The encoder multiplier, according to the present invention, performs two functions. It resolves the encoder signals, and it calibrates the output signal count in real time.

In commercial motion control systems, encoder electronics are packaged with the optical components of the encoder on a printed circuit card, and the control system electronics are packaged on a card that is installed into a computer (PC) mother board.

Incremental encoders are the most commonly used measurement transducers. The most popular sensing technology used in encoders is transmissive optical, although reflective optical and magnetic types are also used. Transmissive optical encoders pass light from a lamp or light-emitting diode through a grating attached to the axis to be measured. The grating normally has two tracks offset 90 signal degrees apart with respect to each other (in quadrature). A single marker on a third track serves a home marker (in the case of a rotary encoder, a once-per-revolution marker). The light passing through the grating continues through a reticle or mask, which together with the grating, acts as a shutter. The shuttered light falling on a detector results in the generation of electrical signals. These signals are amplified and output as two amplified sinusoids or square waves in quadrature and are output on two separate channels as signals SIN and COS. With simple incremental encoders, the position is measured by counting the zero crossings (sinusoidal) or edges (square waves) of both channels. Where greater precision is required, the amplified sinusoidal signals (SIN and COS) are sent to an encoder multiplier where the intermediate positions are resolved at spaced time intervals.

An encoder multiplier uses the SIN and COS signals to resolve many positions within one grating period (scribe lines). The multiplier, for example, is able to produce up to 1,000 transitions within one grating period as opposed to the four by a simple incremental encoder. Thus, a rotary encoder with 1,000 lines will produce 1,000,000 counts per revolution with use of an encoder multiplier. In a typical application, a rotary motor with rotary encoder is connected to a linear stage by a ball screw. The motor shaft rotates the ball screw producing the linear motion of the stage. A ball screw with a 4 mm pitch will produce a linear travel of 4 mm with one full rotation of the motor shaft. The standard 1,000 line encoder will lead to a 1 micrometer resolution system (4 mm/1,000 lines/4 transitions per line). The addition of an encoder multiplier will yield a 4 nanometer system (4 mm/1,000 lines/1,000 transitions per line).

However, the one encoder count will not necessarily correspond to a 4 nanometer move in the linear direction. There are inaccuracies of the gratings of the encoder as well as mechanical errors produced by pitch, roll, and yaw of the stage, backlash, etc.

A laser metrology (laser interferometer) system can be used to very precisely measure the actual position of the stage. Calibration data is obtained by commanding the stage to move to evenly spaced positions and reading the actual position as determined by the laser metrology system. From this data, a calibration file is created. According to the prior art, the calibration data has been used by the controller system to modify the commanded position signal. Using a 4 nanometer system (4 nanometer approximate movement for each encoder pulse), suppose the stage starting at the home position is commanded to move to a position 1 mm from home. Suppose that during the calibration, it had been determined that a commanded movement of 1 mm (250,000 encoder pulses) produced a movement of 1.000012 mm. This indicates a movement of 12 nanometers or three pulses too many. According to the prior art systems, the controller card would recalculate the commanded move, that is, it would command a move of 2,499,997 encoder pulses.

The problem is that if other functions, such as a laser firing card, use the pulses directly from the encoder multiplier card, it would not be in synchronism with the commanded position.

According to this invention, calibration data is stored on the encoder multiplier device. In the above-described situation of a commanded move of 1 mm, the encoder multiplier will add three extra pulses to the output since only 2,499,997 pulses are required to reach the correct position. When the 2,500,000 pulses are received, the stage will be at the 1 mm position and any function to be activated at the 1 mm position will be in synchronism if relying on the encoder multiplier output.

Figure 2:
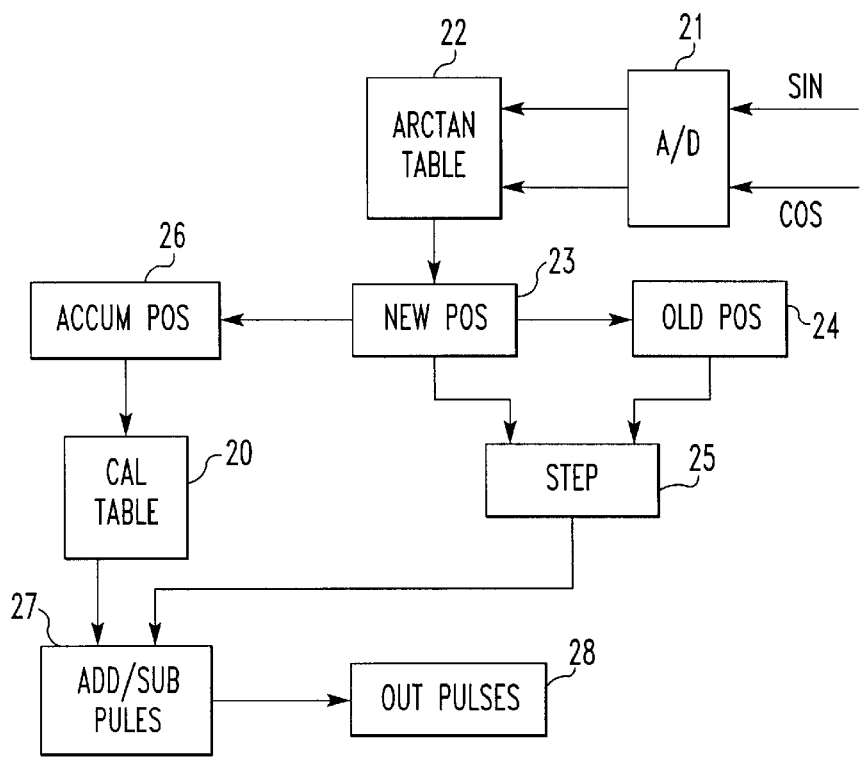
FIG. 2 is a diagram illustrating the flow of information in an encoder multiplier according to the present invention.

Referring to FIG. 2, calibration data would typically be saved in a file in flash memory 20. The reference marker signal from the encoder is used to initialize the lookup table. The following is a description of one cycle within the encoder multiplier. One cycle (the time between interrupts) is 0.5 microseconds. An analog-to-digital converter 21 samples each of the SIN and COS signals from the encoder. Using the converter outputs as addresses to an arctangent table 22, the current position (transition count) of the encoder is determined and saved in a register 23 in a field programmable gate array (FPGA). The FPGA compares the current position (transition count) with the position during the previous encoder cycle stored at 24 to determine how far the encoder has moved and saves the incremental distance in register 25. The incremental distances are accumulated in the absolute position register 26. The value in the absolute position register 26 is used with the calibration table 20 to determine if pulses should be added or subtracted at 27 from the incremental encoder pulse count in register 25 and output at 28 to the control system.

Multiple calibration tables may exist at one time in the flash memory. The multiplier then contains a separate interface (from the controller) used to select which calibration table is currently active. This can be used in an X-Y table configuration to correct errors in the X direction which are Y location dependent. Thus, appropriate X table correction is loaded based on Y axis position.

The multiplier can also send the internal corrected "parallel" position to the controller instead of the corrected quadrature SIN/COS signals. This removes the speed limitations of a typical industrial serial interface and allows a much higher effective data rate. For example, an RS422 serial interface has a maximum data transmission rate of around 32 MHz. For quadrature output, the maximum encoder data rate is 32 MHz. If the internal parallel position was sent to the controller at a 32 MHz bit rate, and assuming 24 bits of parallel position data and 8 bits of error detection, the effective data rate is increased to greater than $8\times10^9$ Hz.

Having thus defined our invention in the detail and particularity required by the Patent Laws, what is desired protected by Letters Patent is set forth in the following claims.

What is claimed is:

1. A device for receiving first and second analog signals consisting of two sinusoidal signals shifted in phase from an encoder and outputting digital pulses corresponding to the approximate number of equal steps the system of which the encoder is a part has advanced or retreated comprising:

an analog-to-digital converter for digitizing the input signals;

an arctangent lookup table for calculating a relative value count within one input signal period from the digitized input signals;

a cycle detector for recognizing advance or retreat to an adjacent first or second signal period;

an up/down counter for holding the total value counts accumulated since the system has moved from a datum position;

flash memory storing a table relating total value counts to the precise value as previously determined by calibration;

a digital processor having a defined interrupt interval, said digital processor programmed, in response to each new interrupt interval, to:

i) digitize the first and second analog quadrature signals to produce first and second digitized signals, ii) input the first and second digitized signals and with reference to the arctangent table to calculate the value count, iii) subtract the current value count from the last value count within one signal period and storing in a difference register, and iv) with reference to the flash memory table add or subtract counts to or from the difference register so that the count in the difference register corresponds to the calibrated value moved by the system, a pulse generator for generating the number of pulses in the difference register within an interrupt interval; and means for conveying the calibrated value to an external device.

2. The device according to claim 1, wherein the encoder is a linear position encoder and the value counts are linear distance counts.

3. The device according to claim 1, wherein the encoder is a rotary position encoder and the value counts are angular distance counts.

4. The device according to claim 1, wherein the flash memory stores a table based upon calibration with a laser interferometer.

5. The device according to claim 1, wherein the first and second signals are in quadrature.

6. The device according to claim 1, wherein the system responds to changes selected from the group position, temperature, humidity, light intensity, and sound level.

7. The device according to claim 1, wherein the encoder has multiple tables in flash memory and means for selecting the active table.

* * * * *